US012564090B2

(12) United States Patent
Mallik et al.

(10) Patent No.: US 12,564,090 B2
(45) Date of Patent: *Feb. 24, 2026

(54) EDGE-ALIGNED TEMPLATE STRUCTURE FOR INTEGRATED PACKAGES INCLUDING AN INTEGRATED CIRCUIT DEVICE WITHIN AN OPENING OF THE TEMPLATE STRUCTURE

(71) Applicant: Intel Corporation, Santa Clara, CA (US)

(72) Inventors: Debendra Mallik, Chandler, AZ (US); Omkar Karhade, Chandler, AZ (US); Sairam Agraharam, Chandler, AZ (US); Nitin Deshpande, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 918 days.

This patent is subject to a terminal disclaimer.

(21) Appl. No.: 17/557,925

(22) Filed: Dec. 21, 2021

(65) Prior Publication Data

US 2023/0197546 A1    Jun. 22, 2023

(51) Int. Cl.
*H01L 23/31* (2006.01)
*H01L 21/56* (2006.01)
(Continued)

(52) U.S. Cl.
CPC .......... *H01L 23/3114* (2013.01); *H01L 21/56* (2013.01); *H01L 23/481* (2013.01);
(Continued)

(58) Field of Classification Search
CPC ... H01L 21/56; H01L 23/3114; H01L 23/367; H01L 23/481; H01L 25/0657;
(Continued)

(56) References Cited

U.S. PATENT DOCUMENTS

| | | |
|---|---|---|
| 7,312,519 B2 | 12/2007 | Song et al. |
| 7,659,609 B2 | 2/2010 | Ha et al. |

(Continued)

OTHER PUBLICATIONS

Extended European Search Report from European Patent Application No. 22214330.7 notified May 19, 2023, 8 pgs.

*Primary Examiner* — Khiem D Nguyen
(74) *Attorney, Agent, or Firm* — Essential Patents Group, LLP

(57) ABSTRACT

Integrated circuit assemblies can be fabricated on a wafer scale, wherein a base template, having a plurality of openings, may cover a base substrate, such as a die wafer, wherein the base substrate has a plurality of first integrated circuit devices formed therein and wherein at least one second integrated circuit device is electrically attached to a corresponding first integrated circuit device through a respective opening in the base template. Thus, when the base substrate and base template are singulated into individual integrated circuit assemblies, the individual integrated circuit assemblies will each have a first integrated circuit that is edge aligned to a singulated portion of the base template. The singulated portion of the base template can provide an improved thermal path, mechanical strength, and/or electrical paths for the individual integrated circuit assemblies.

20 Claims, 10 Drawing Sheets

(51) Int. Cl.

| | |
|---|---|
| *H01L 23/00* | (2006.01) |
| *H01L 23/48* | (2006.01) |
| *H01L 23/498* | (2006.01) |
| *H01L 25/065* | (2023.01) |

(52) U.S. Cl.

CPC ........ *H01L 23/49816* (2013.01); *H01L 24/16* (2013.01); *H01L 25/0657* (2013.01); *H01L 2224/32145* (2013.01); *H01L 2225/06517* (2013.01)

(58) Field of Classification Search

CPC . H01L 2225/06548; H01L 2225/06555; H01L 2224/08145; H01L 25/50; H01L 23/5386; H01L 25/0652

See application file for complete search history.

(56) References Cited

U.S. PATENT DOCUMENTS

| | | | |
|---|---|---|---|
| 9,397,027 B1 | 7/2016 | Chen et al. | |
| 10,818,570 B1 * | 10/2020 | England | H01L 23/367 |
| 12,136,597 B2 | 11/2024 | Tsai et al. | |
| 2009/0085178 A1 | 4/2009 | Ha et al. | |
| 2010/0237483 A1 | 9/2010 | Chi et al. | |
| 2012/0001322 A1 | 1/2012 | Liu et al. | |
| 2015/0001701 A1 * | 1/2015 | Li | H05K 5/03 |
| | | | 257/713 |
| 2015/0318246 A1 * | 11/2015 | Yu | H01L 21/76807 |
| | | | 257/774 |
| 2016/0099214 A1 * | 4/2016 | Dalal | H05K 1/0283 |
| | | | 438/126 |
| 2017/0269395 A1 * | 9/2017 | Heck | H01S 5/0064 |
| 2020/0212006 A1 * | 7/2020 | Chang | H01L 25/50 |
| 2020/0343218 A1 | 10/2020 | Hu et al. | |
| 2020/0357768 A1 * | 11/2020 | Shih | H01L 23/49838 |
| 2020/0411473 A1 | 12/2020 | Chen et al. | |
| 2021/0028145 A1 | 1/2021 | Yu et al. | |
| 2021/0375708 A1 * | 12/2021 | Kuo | H01L 21/486 |
| 2021/0375792 A1 * | 12/2021 | Sax | H01L 23/3142 |
| 2022/0037231 A1 * | 2/2022 | Hsiao | H01L 21/563 |
| 2022/0157732 A1 | 5/2022 | Tsai et al. | |
| 2022/0359489 A1 | 11/2022 | Wu et al. | |
| 2022/0384212 A1 | 12/2022 | Chang et al. | |
| 2023/0282614 A1 | 9/2023 | Hsieh et al. | |
| 2024/0413125 A1 | 12/2024 | You et al. | |
| 2025/0112153 A1 | 4/2025 | Meric et al. | |
| 2025/0112163 A1 | 4/2025 | Mishra et al. | |
| 2025/0112165 A1 | 4/2025 | Marin et al. | |

* cited by examiner

COMPUTING DEVICE 800

EDGE-ALIGNED TEMPLATE STRUCTURE FOR INTEGRATED PACKAGES INCLUDING AN INTEGRATED CIRCUIT DEVICE WITHIN AN OPENING OF THE TEMPLATE STRUCTURE

TECHNICAL FIELD

Embodiments of the present description generally relate to the field of integrated circuit device packaging, and, more specifically, to structures within stacked integrated circuit packages that assist in the mechanical, thermal, and/or electrical performance of the package.

BACKGROUND

The integrated circuit industry is continually striving to produce ever faster, smaller, and thinner integrated circuit devices and packages for use in various electronic products, including, but not limited to, computer servers and portable products, such as portable computers, electronic tablets, cellular phones, digital cameras, and the like.

One way to achieve these goals is by increasing integration density, such as by stacking components within the integrated circuit assemblies. One stacking method may comprise stacking and electrically attaching at least one relatively small integrated circuit device to a relatively large integrated circuit device to form an integrated circuit package. In one example, the large integrated circuit device may be configured to be attached to an electronic substrate or board and the at least one small integrated circuit device or tile may be on top of the larger integrated circuit device. Extra space around the at least one small integrated circuit device may be "filled" with passive die-like structures(s), such as silicon structures, to function as thermo-mechanical structure(s), which may provide a thermal path for the larger integrated circuit device and may assist in maintaining the mechanical integrity of the integrated circuit package, as will be understood to those skilled in the art. However, as the thermo-mechanical structure(s) cannot be perfectly aligned to the edge(s) of the larger integrated circuit device (due to placement tolerance and stack die dicing tolerances), there is considerable area that has to be left uncovered and must be filled with mold or oxide materials. Additionally, as the thermo-mechanical structure(s) are generally rectangular, during wafer level stacking process, the base die wafer (which has the larger integrated circuit formed therein) remains unprotected by mechanically robust thermo-mechanical structures(s) around the wafer edge areas, as will be understood to those skilled in the art.

In another example, the at least one small integrated circuit devices may be configured to be attached to an electronic substrate or board and the larger integrated circuit device or tile may be on top of the at least one small integrated circuit device. Extra space around the at least one small integrated circuit device may be "filled" with a dielectric material, such as silicon dioxide, that has embedded electrically conductive vias, called through-dielectric vias (TDV), within the dielectric material. The through-dielectric vias may provide electrical paths between the larger integrated circuit and an electronic substrate or board. However, the dielectric material has some limitations, such generally being poor thermal conductor and being relatively mechanically weak compared to the materials from which the large and small integrated circuit device are formed, such as silicon. Furthermore, using the dielectric material limits the maximum thickness of the at least one small integrated circuit device to between about 20 and 30 microns due to manufacturing constraints Thus, there is an on-going effort to improve the structure, reliability, and manufacturability of such stacked integrated circuit packages.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
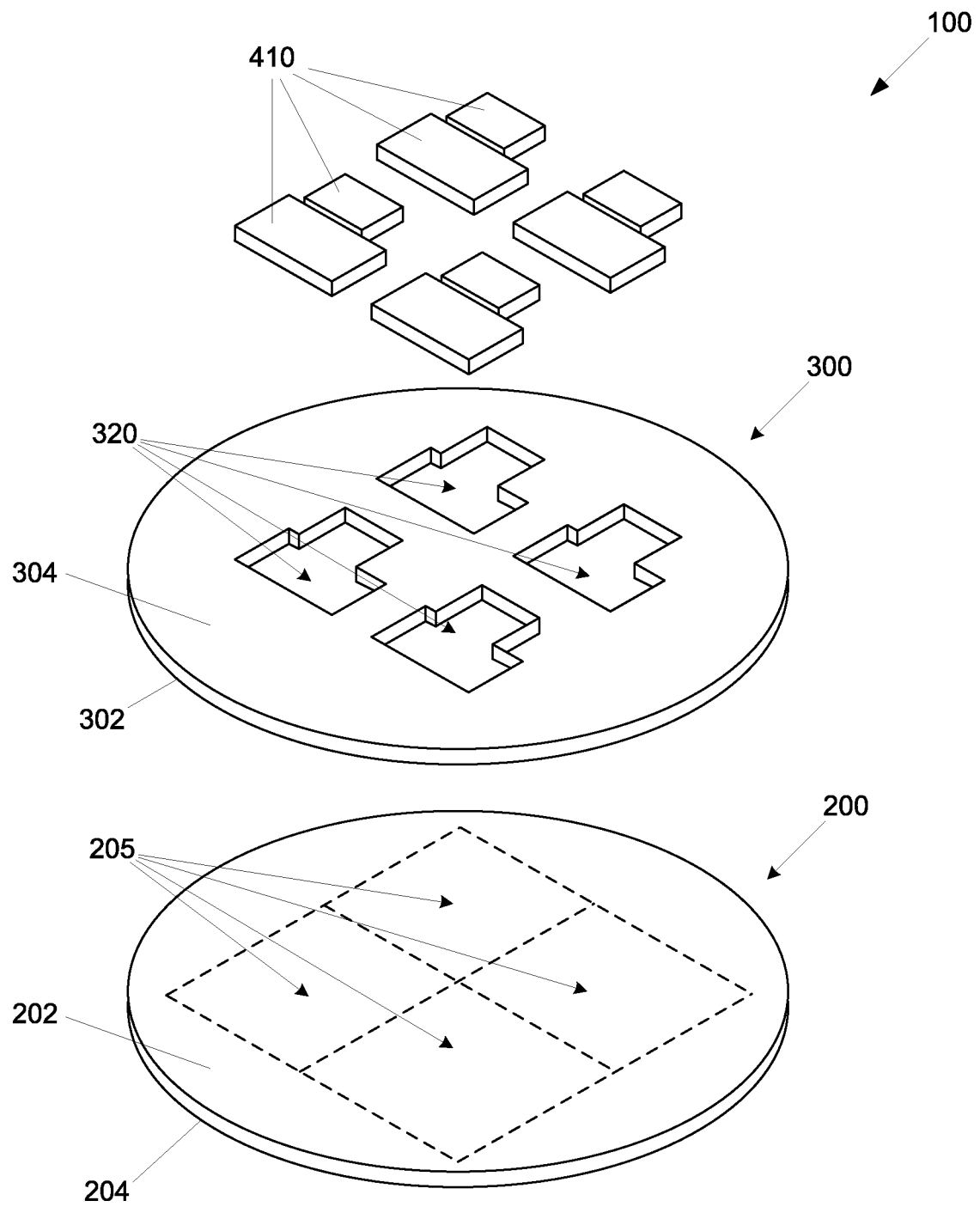
FIGS. 1-3 are oblique, exploded and assembled views of a wafer-level integrated circuit assembly, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that the elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to the fabrication of integrated circuit assemblies. In one embodiment of the present description, the integrated circuit assemblies can be fabricated on a wafer scale, wherein a base template, having a plurality of openings, may cover a base substrate, such as a die wafer, wherein the base substrate has a plurality of first integrated circuit devices formed therein and wherein at least one second integrated circuit device is electrically attached to a corresponding first integrated circuit device through a respective opening in the base template. Thus, when the base substrate and base template are singulated into individual integrated circuit assemblies, the individual integrated circuit assemblies will each have a first integrated circuit that is edge aligned to a singulated portion of the base template. The singulated portion of the base template can provide an improved thermal path, mechanical strength, and/or electrical paths for the individual integrated circuit assemblies.

Figure 2:
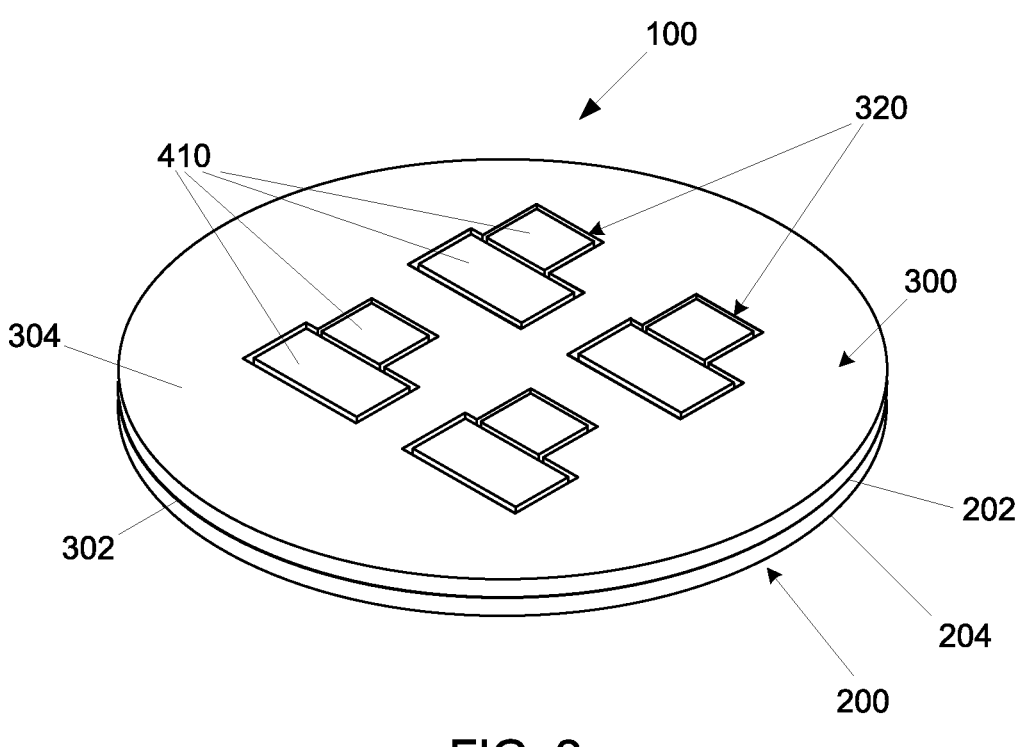

FIGS. 1 and 2 illustrate an exploded view and an assembled view of a wafer-level integrated circuit assembly 100. As shown in FIG. 1, the wafer-level integrated circuit assembly 100 may comprise a base substrate 200, such as semiconductor wafer, having a first surface 202, an opposing second surface 204, and a plurality of first integrated circuit configurations 205 (demarked by dashed lines) formed in and/or on the first surface 202 of the base substrate 200. The wafer-level integrated circuit assembly 100 may further include a base template 300 having a first surface 302, an opposing second surface 304, and at least one opening 320 extending from the first surface 302 to the second surface 304 of the base template 300. The wafer-level integrated circuit assembly 100 may still further include at least one second integrated circuit device 410.

Referring to the assembled view of the wafer-level integrated circuit assembly 100 of FIG. 2, the first surface 202 of the base substrate 200 may be attached to the first surface 302 of the base template 300. As further illustrated, the at least one second integrated circuit device 410 may be positioned within a respective opening 320 in the base template 300 and the at least one second integrated circuit device 410 may be electrically attached to the first surface 202 of the base substrate 200.

Figure 3:
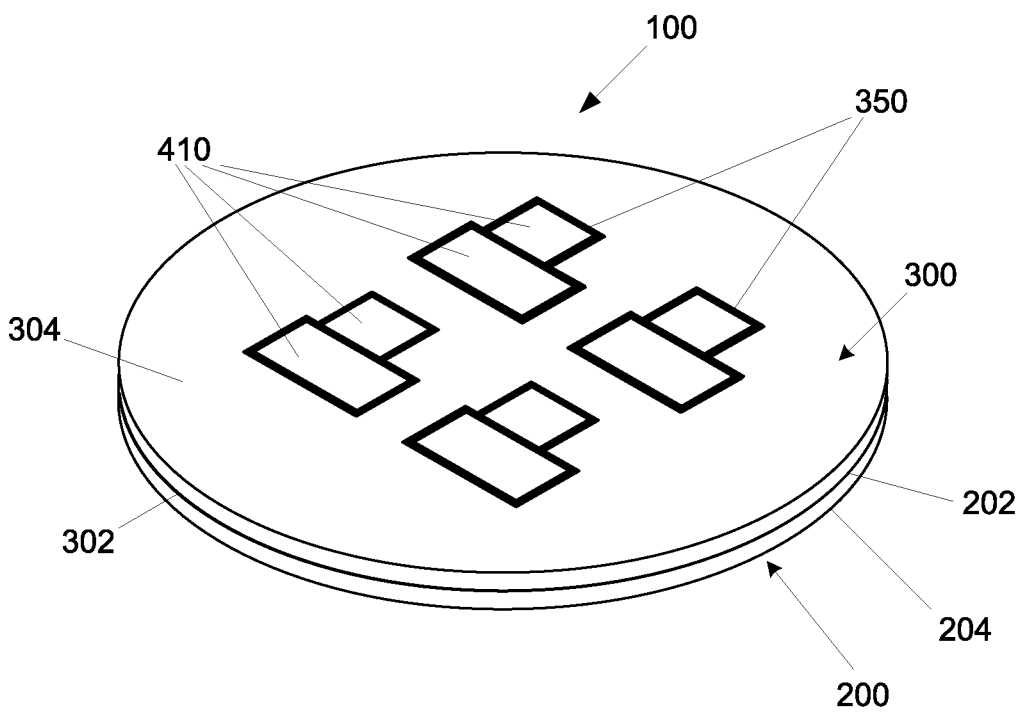
Figure 4:
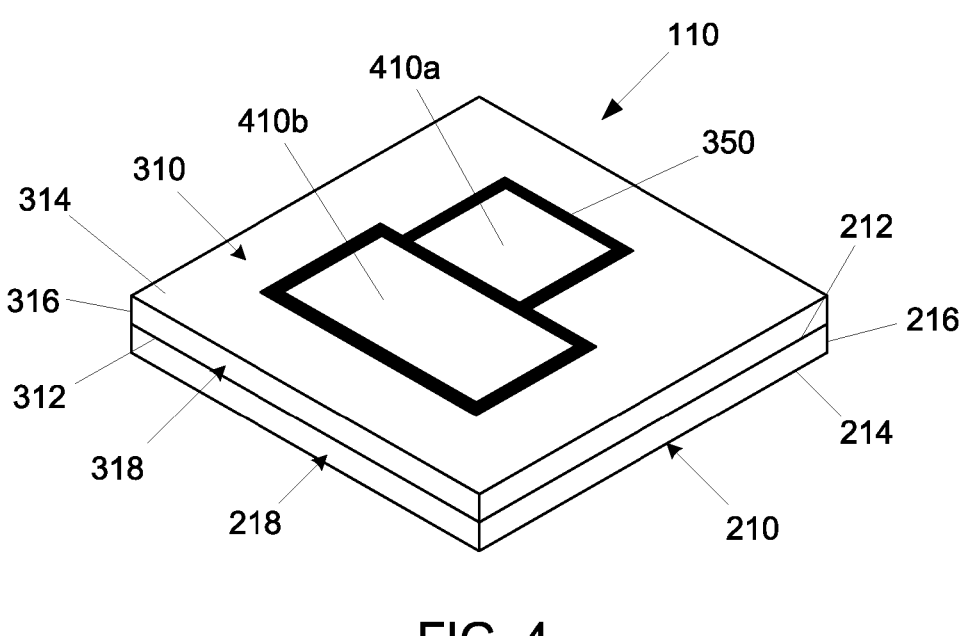
FIG. 4 is an oblique view of a diced integrated circuit assembly, according to one embodiment of the present description.

As shown in FIG. 3, any gap(s) between the at least one opening(s) 320 (see FIG. 2) and the base template 300 may be filled with a fill material 350, such as an organic material (e.g., epoxy mold material), an inorganic material (e.g., silicon dioxide), or the like. The wafer-level integrated circuit assembly 100 of FIG. 2 may be diced or singulated, such as with a wafer saw, to form at least one integrated circuit assembly 110, wherein the dicing/singulation process forms at least one first integrated circuit device 210 from the base substrate 200 (see FIG. 2) and forms at least one template structure 310 from the base template 300 (see FIG. 2). In one embodiment of the present description, the first integrated circuit device 210 may have a first surface 212, an opposing second surface 214, and at least one side 216 extending between the first surface 212 and the second surface 214, wherein all of the sides 216 define a periphery 218 of the first integrated circuit device 210. In an embodiment of the present description, the template structure 310 may have a first surface 312, an opposing second surface 314, at least one side 316 extending between the first surface 312 and the second surface 314 thereof, and the at least one opening 320 may extend between the first surface 312 and the second surface 314, wherein all of the sides 316 define a periphery 318 of the template structure 310, wherein the first surface 312 of the template structure 310 is attached to the first surface 212 of the first integrated circuit device 210. In a further embodiment of the present description, the at least one second integrated circuit device 410 (illustrated as two elements 410a and 410b) may be within the opening 320 of the template structure 310, wherein the at least one second integrated circuit device 410a, 410b is electrically attached to the first surface 212 of the first integrated circuit device 210. In an embodiment of the present description, at least one side 216 of the first integrated circuit device 210 may be substantially planar with at least one side 316 of the template structure 310. In one embodiment of the present description, the periphery 218 of the first integrated circuit device 210 may be substantially planar with the periphery 318 of the template structure 310.

The at least one first integrated circuit device 210 and the at least one second integrated circuit device 410a, 410b may be any appropriate device, including, but not limited to, a microprocessor, a chipset, a graphics device, a wireless device, a memory device, an application specific integrated circuit, a transceiver device, an input/output device, combinations thereof, stacks thereof, and the like.

In an embodiment of the present description, the template structure 310 may be a thermally conductive material. The thermally conductive material may be any appropriate material, including, but not limited to, copper tungsten, silicon carbide, diamond, and the like. In a further embodiment of the present description, the template structure 310 may have a coefficient of thermal expansion that is substantially the same as the coefficient of thermal expansion of the at least one first integrated circuit device 210 and/or the at least one second integrated circuit device 410a, 410b. In one embodiment, the template structure 310 may comprise silicon, glass with a tuned coefficient of thermal expansion, and the like. In a still a further embodiment of the present description, the template structure 310 may be a structurally rigid material to provide mechanical strength to the integrated circuit assembly 110. In one embodiment, this structurally rigid material may comprise stainless steel. As will be understood in light of the present description, having a template structure 310 that has mechanical properties similar to those of the first integrated circuit device 210 may make the integrated circuit assembly 110 closer to a monolithic die, which can enable further stacking of integrated circuit devices and may also enable finer pitched interconnection layers, as will be discussed.

Figure 5:
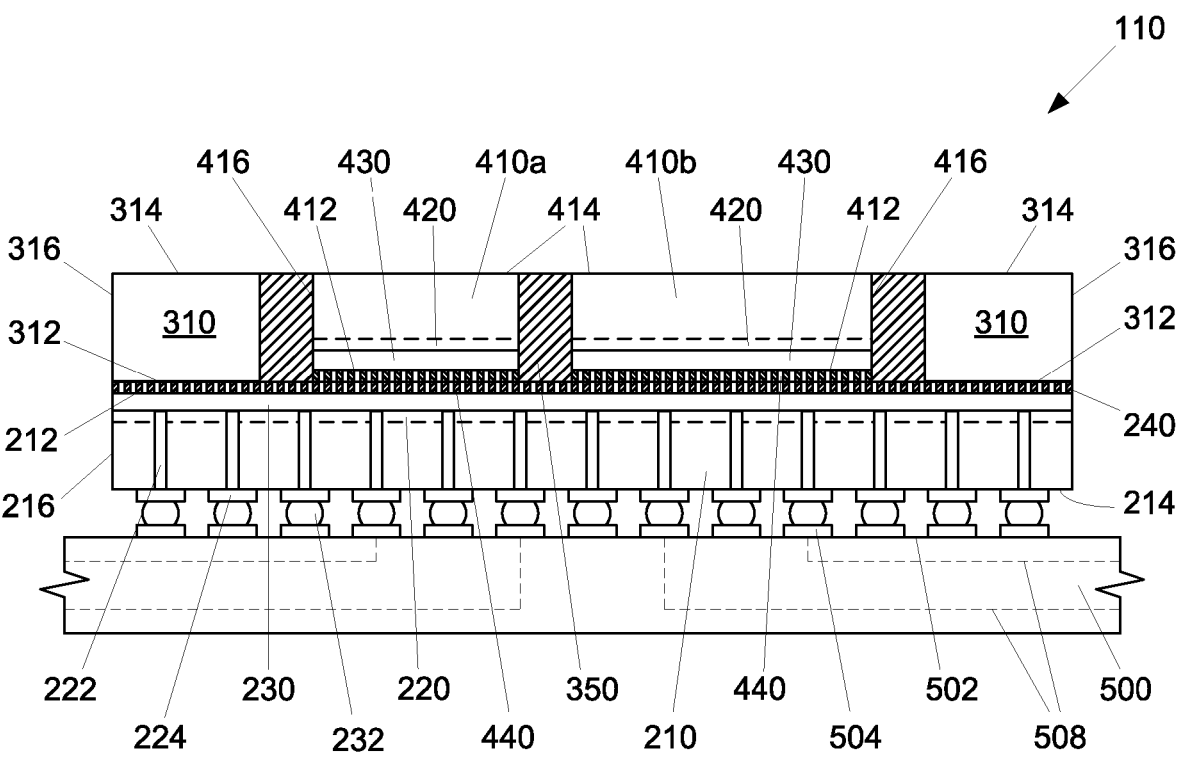
FIGS. 5-15 are side cross-sectional views of various integrated circuit assemblies electrically attached to an electronic substrate, according to embodiments of the present description.

As shown in FIG. 5, the at least one second integrated circuit device 410a, 410b may have a first surface 412, an opposing second surface 414, and at least one side 416 extending between the first surface 412 and the second surface 414 thereof. In one embodiment of the present description, the first surface 412 of the at least one second integrated circuit device 410a, 410b may be electrically attached to the first surface 212 of the first integrated circuit device 210. In an embodiment of the present description, the second surface 414 of the at least one second integrated circuit device 410a, 410b may be substantially planar to the second surface 314 of the template structure 310.

As will be understood to those skilled in the art, integrated circuit devices have integrated circuit components, such as transistors, formed on one surface of a semiconductive material substrate or wafer, such silicon, silicon germanium, and the like. Thus, the at least one first integrated circuit device 210 may have a component zone 220 (demarked by a dashed line) therein at the first surface 212 thereof. A routing layer 230 may be formed on the component zone 220 of first integrated circuit device 210 and an interconnection layer 240 may be formed on the routing layer 230. As will be understood to those skilled in the art, the routing layer 230 may contain electrical routes/traces (not shown) to electrically interconnect integrated circuit components (not shown) within the component zone 220 and to electrically connect the integrated circuit components (not shown) with the interconnection layer 240. The interconnection layer 240 may comprises a plurality of interconnect structures (illustrated, but not specifically labeled) extending through a dielectric material layer (illustrated, but not specifically labeled). Routing layers, such as the routing layer 230, and interconnection layers, such as the interconnection layer 240, are well known in the art and, for the purposes of clarity and conciseness, will not be discussed herein. Likewise, the at least one second integrated circuit device 410a, 410b may have a component zone 420 therein proximate the first surface 412 thereof. A routing layer 430 may be formed on the component zone 420 of the at least one second integrated circuit device 410a, 410b and an interconnection layer 440 may be formed on the routing layer 430. As will be understood to those skilled in the art, the routing layer 430 may contain electrical routes/traces (not shown) to electrically interconnect integrated circuit components (not shown) within the component zone 420 and to electrically connect the integrated circuit components (not shown) with the interconnection layer 440. The interconnection layer 440 may comprises a plurality of interconnect structures (illustrated, but not specifically labeled) extending through a dielectric material layer (illustrated, but not specifically labeled). The interconnection layer 240 of the at least one first integrated circuit device 210 may be attached to the interconnection layer 440 of the at least one second integrated circuit device 410a, 410b, such as by a hybrid bonding technique, as known in the art.

As further shown in FIG. 5, the at least one first integrated circuit device 210 may have a plurality of through-silicon vias 222 extending from the routing layer 230 to a plurality of bond pads 224 on or in the second surface 214 of the at least one first integrated circuit device 210. The integrated circuit assembly 110 may be attached to a package substrate 500 with a plurality of device-to-substrate interconnects 232 extending between the plurality of bond pads 224 of the at least one first integrated circuit device 210 and the plurality of bond pads 504 on a first surface 502 of the package substrate 500. The device-to-substrate interconnects 232 may be any appropriate electrically conductive material or structure, including, but not limited to, solder balls, metal bumps or pillars, metal filled epoxies, or a combination thereof. In one embodiment of the present description, the device-to-substrate interconnects 232 may be solder balls formed from tin, lead/tin alloys (for example, 63% tin/37% lead solder), and high tin content alloys (e.g., 90% or more tin—such as tin/bismuth, eutectic tin/silver, ternary tin/silver/copper, eutectic tin/copper, and similar alloys). In another embodiment of the present description, the device-to-substrate interconnects 232 may be copper bumps or pillars. In a further embodiment of the present description, the device-to-substrate interconnects 232 may be metal bumps or pillars coated with a solder material.

The package substrate 500 may be any appropriate structure, including, but not limited to, an interposer, printed circuit board, and the like. The package substrate 500 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

The package substrate 500 may further include conductive routes 508 or "metallization" (shown in dashed lines) extending through the package substrate 500. As will be understood to those skilled in the art, the conductive routes 508 may be a combination of conductive traces (not shown) and conductive vias (not shown) extending through the plurality of dielectric material layers (not shown). These conductive traces and conductive vias are well known in the art and are not shown in FIG. 5 for purposes of clarity. The conductive traces and the conductive vias may be made of any appropriate conductive material, including but not limited to, metals, such as copper, silver, nickel, gold, and aluminum, alloys thereof, and the like.

As further shown in FIG. 5, the interconnection layer 240 may be formed over the entire first surface 212 of the at least one first integrated circuit device 210. Thus, the template structure 310 may be attached to the first surface 212 of the at least one first integrated circuit device 210 by fusion bonding, such as an oxide-oxide bond, as will be understood to those skilled in the art.

Figure 6:
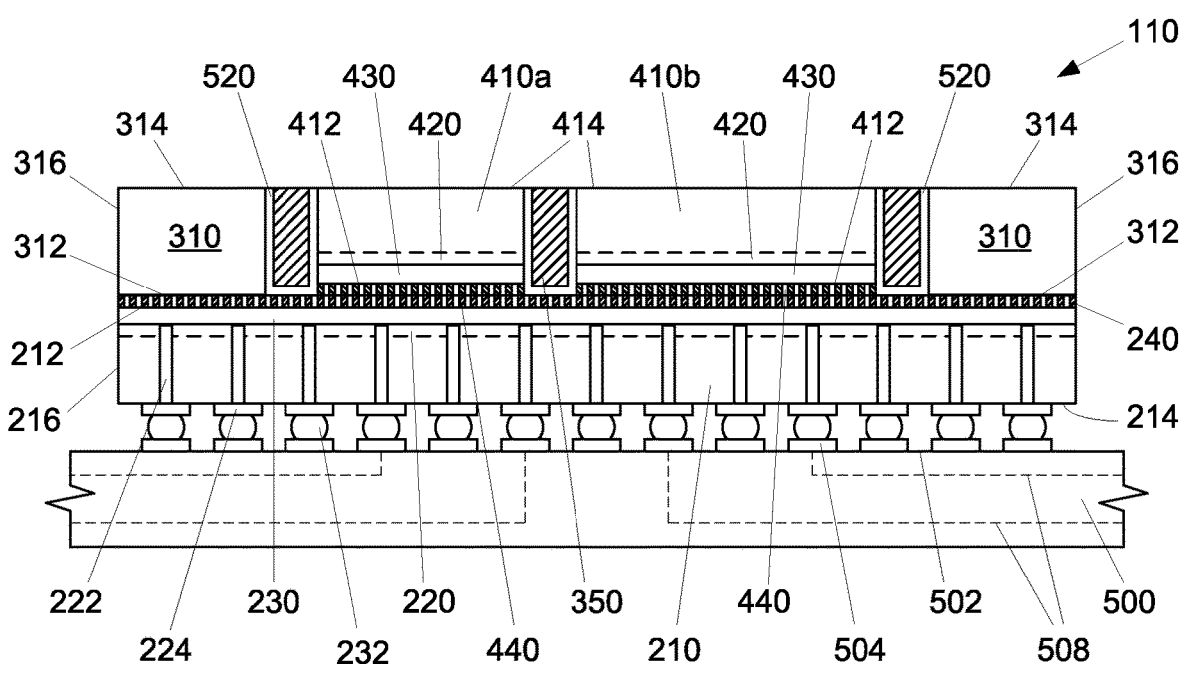
Figure 7:
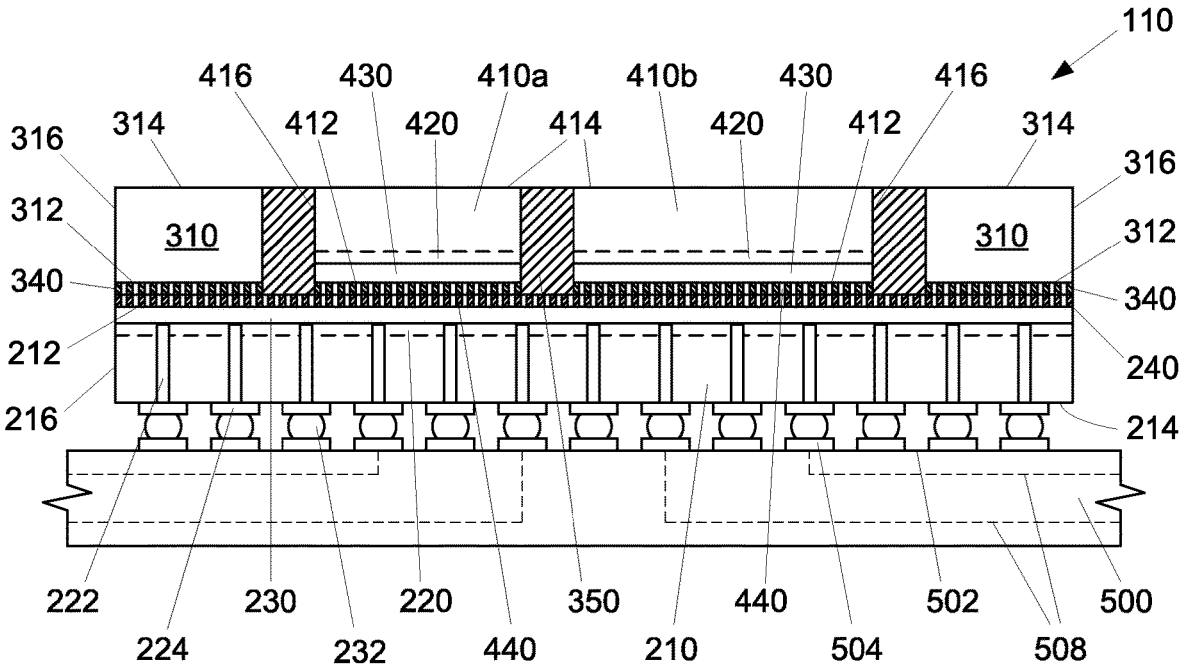
Figure 8:
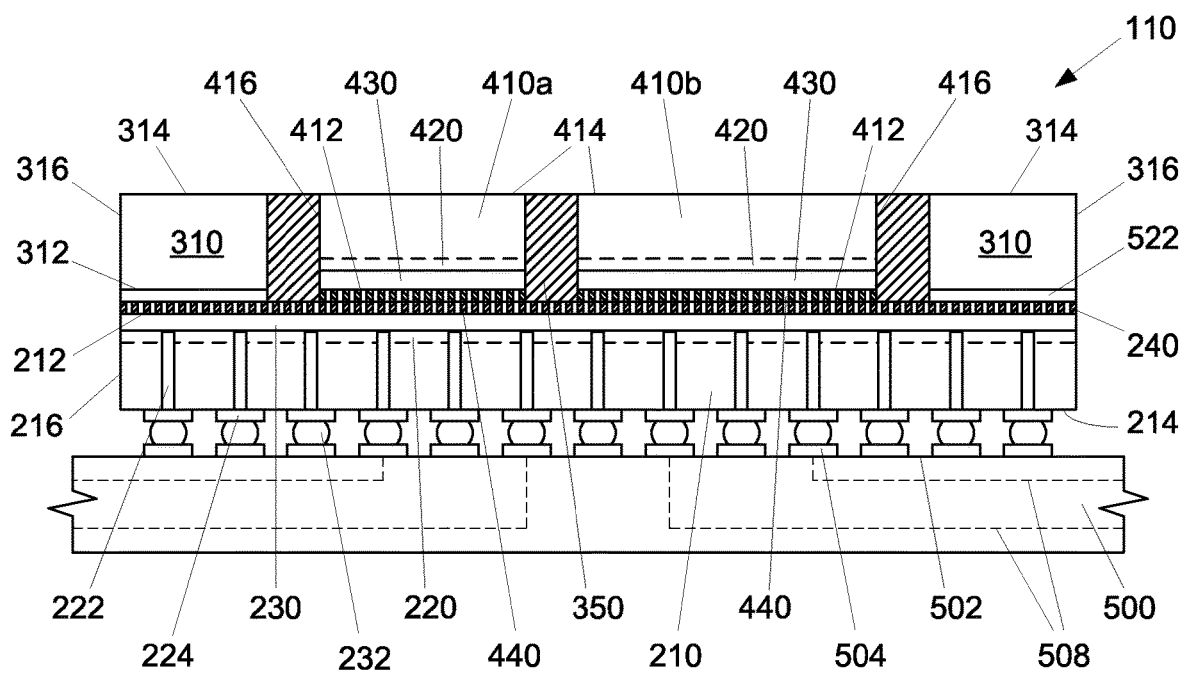

As shown in FIG. 6, a barrier layer 520, such as silicon nitride, may be deposited prior to depositing the fill material 350 to prevent moisture or other contaminants from encroaching into the integrated circuit assembly 110. As shown in FIG. 7, an interconnection layer 340 may be formed on the first surface 312 of the template structure 310, such that the template structure 310 may be attached with the same technique and at the same time as the attachment of the at least one second integrated circuit device 410a, 410b. In another embodiment of the present description, as shown in FIG. 8, the template structure 310 may be attached to the first surface 212 of the at least one first integrated circuit device 210 with an adhesion layer 522.

Figure 9:
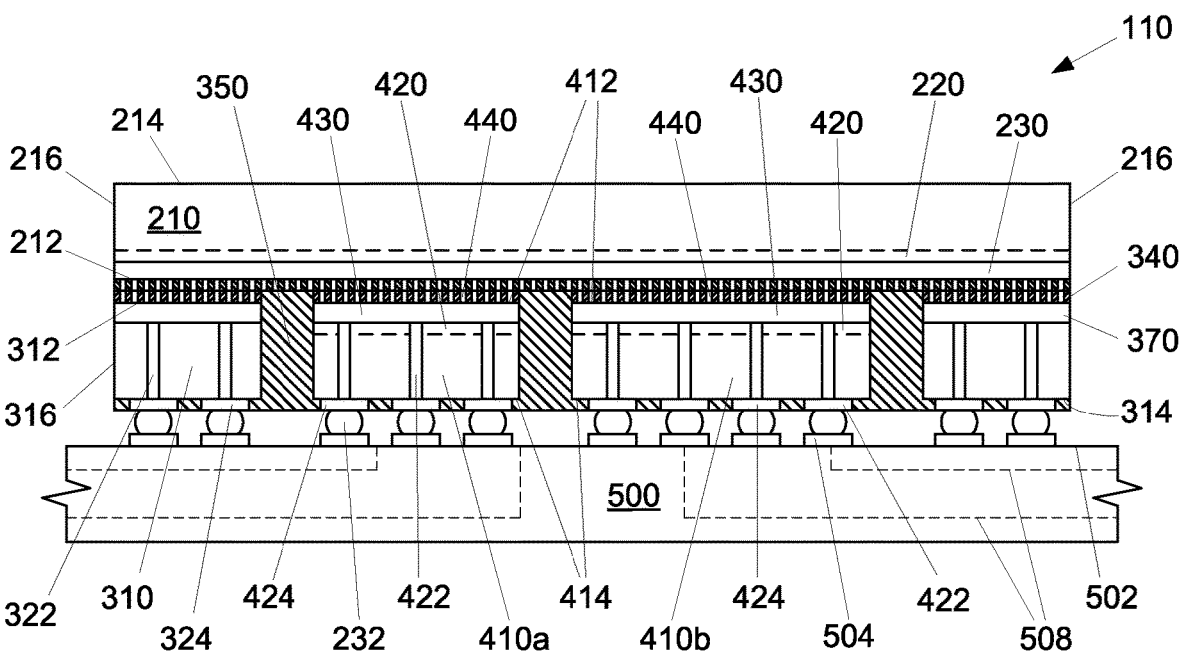

In further embodiments of the present description, the integrated circuit assembly 110 may have a flipped or reversed orientation with regard to its attachment to the package substrate 500. In one embodiments of the present description, as shown in FIG. 9, the at least one second integrated circuit device 410a, 410b may have a plurality of through-silicon vias 422 extending from the component zone 420 to a plurality of bond pads 424 on or in the second surface 414 of the at least one first integrated circuit 410a, 410b. The integrated circuit assembly 110 may be attached to the package substrate 500 with the plurality of device-to-substate interconnects 232 extending between the plurality of bond pads 424 of the at least one second integrated circuit device 410a, 410b and the plurality of bond pads 504 on the first surface 502 of the package substrate 500. Furthermore, the template structure 310 may have a plurality of through-template vias 322 extending from the first surface 312 of the template structure 310 to a plurality of bond pads 324 on or in the second surface 314 of the template structure 310. The integrated circuit assembly 110 may further be attached to the package substrate 500 with the plurality of device-to-substrate interconnects 232 extending between the plurality of bond pads 424 of the at least one second integrated circuit device 410a, 410b and the plurality of bond pads 504 on the first surface 502 of the package substrate 500. As further shown in FIG. 9, since the through-template vias 322 will be forming electrical connections between the package substrate 500 and the integrated circuit assembly 110, a routing layer 370 formed at the first surface 312 of the template structure 310 and the interconnection layer 340 may be formed on the routing layer 370. As still further shown in FIG. 9, the fill material 350 may extend over the second surface 414 of the at least one second integrated circuit device 410a, 410b and over the second surface 314 of the template structure 310. In one embodiment of the present description, the plurality of through-template vias 322 of the template structure 310 and the plurality of through-silicon vias 422 of the at least one second integrated circuit device 410*a*, 410*b* made be formed prior to the formation of the integrated circuit assembly 110. In another embodiment of the present description, the plurality of through-template vias 322 of the template structure 310 and the plurality of through-silicon vias 422 of the at least one second integrated circuit device 410*a*, 410*b* made be formed after the formation of the integrated circuit assembly 110.

Figure 10:
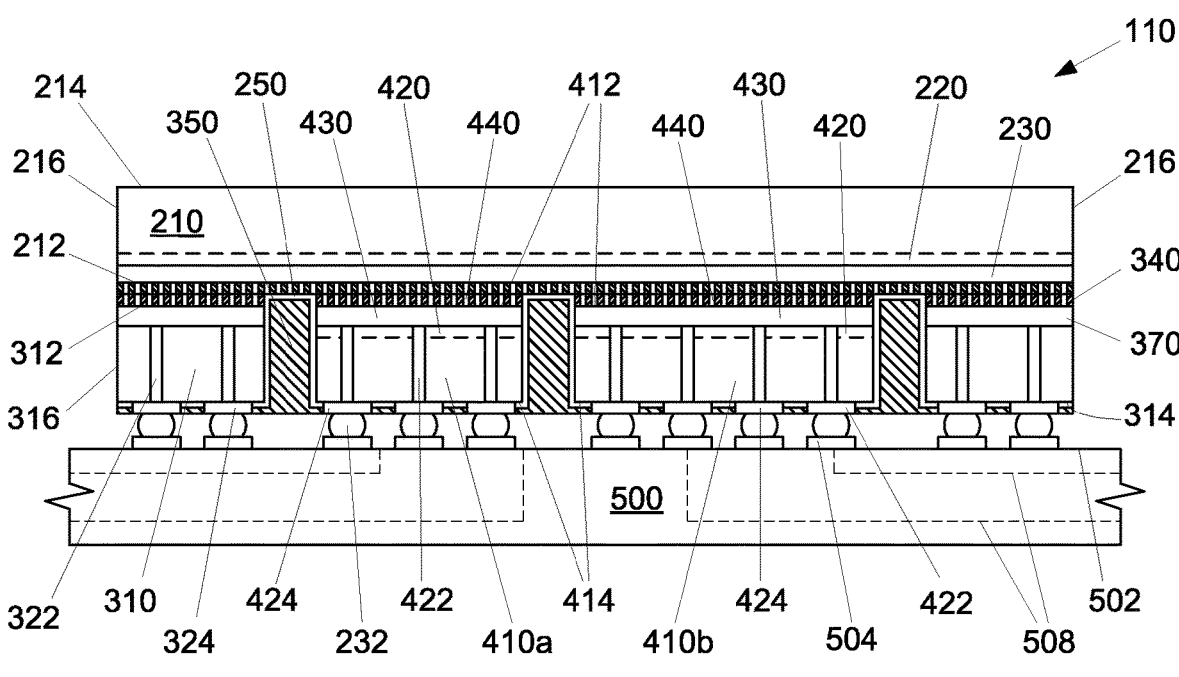

As with the embodiment shown in FIG. 6, the barrier layer 520, such as silicon nitride, may be deposited prior to depositing the fill material 350 to prevent moisture of other contaminants from encroaching into the integrated circuit assembly 110, as shown in FIG. 10. In this embodiment of the present description, the barrier layer 520 may extend over the second surface 414 of the at least one second integrated circuit device 410*a*, 410*b* and over the second surface 314 of the template structure 310.

Figure 11:
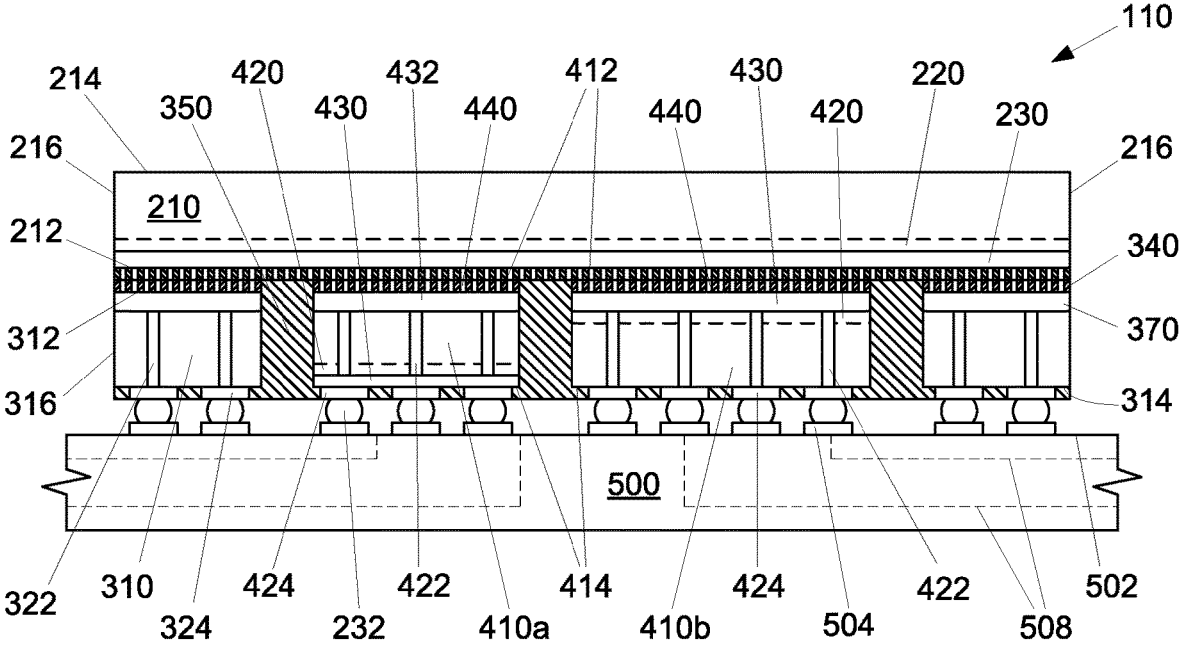

In one embodiment of the present description, as shown in FIG. 11, at least one of the at least one second integrated circuit 410*a*, 410*b* may have an inverted orientation to that shown in FIGS. 9 and 10. As illustrated in FIG. 11, the first surface 412 of the second integrated circuit 410*a* may be electrically attached to the package substrate 500 and the through-silicon vias 422 may be electrically connected to a routing layer 432 at the second surface 414 of the second integrated circuit 410*a* and the interconnection layer 440, as previously discussed, may be formed on the routing layer 432.

Figure 12:
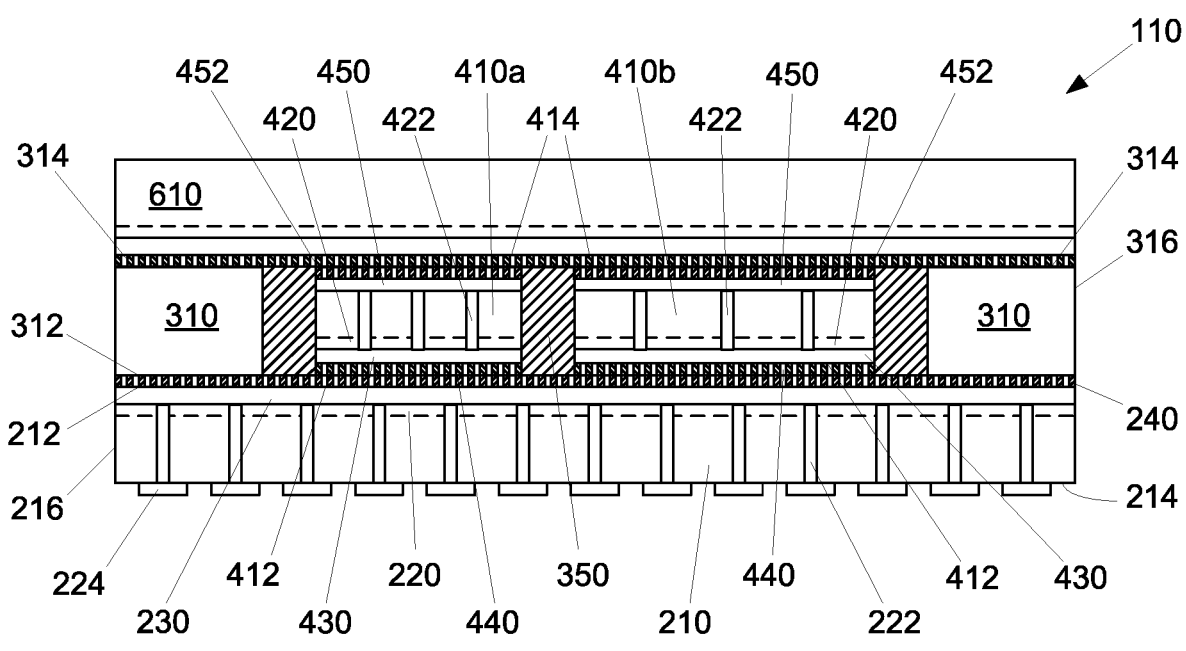
Figure 13:
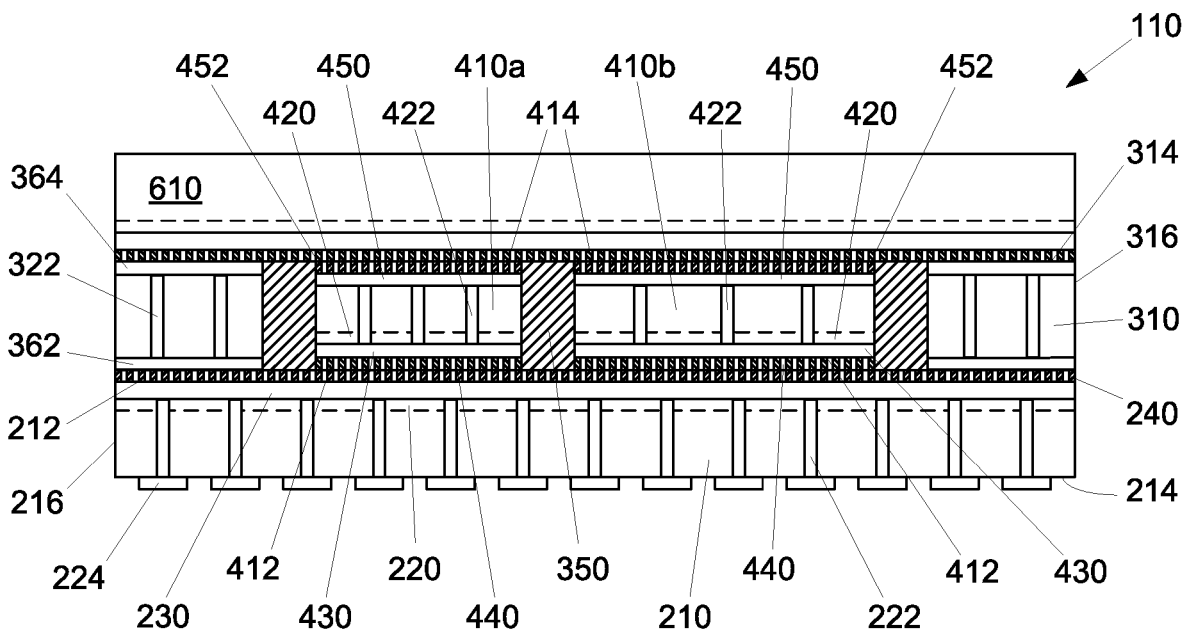

Although the embodiments illustrated in FIG. 1-11 describe two levels of integrated circuit devices, the embodiments of the present description are not so limited. As shown in FIGS. 12 and 13, at least one third integrated circuit device 610 may be electrically attached to the at least one second integrated circuit device 410*a*, 410*b* and/or the at least one first integrated circuit device 210, such as using structures previously discussed. The template structure 310 may include through-template vias 322, as shown in FIG. 13, or not, as shown in FIG. 12.

Figure 14:
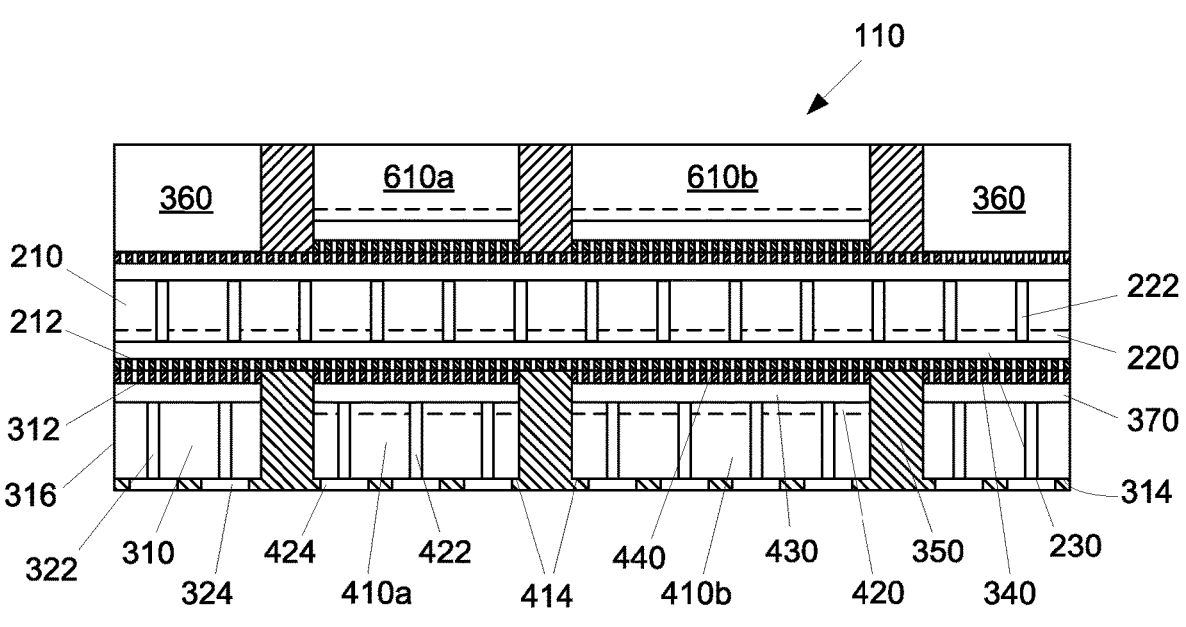
Figure 15:
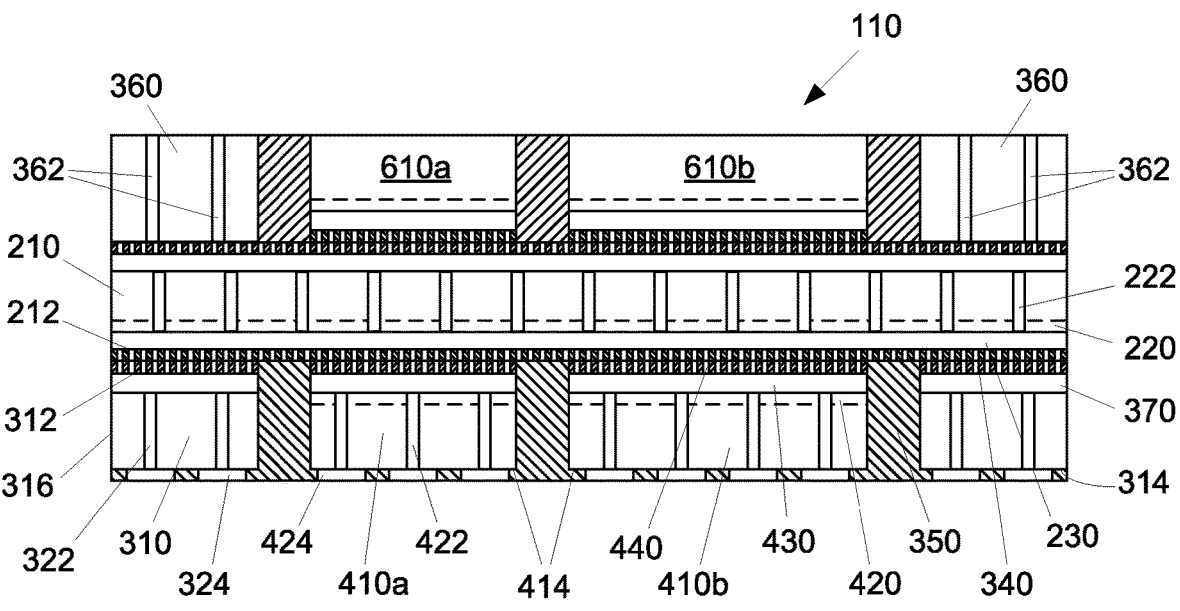

Although the embodiments illustrated in FIG. 1-13 describe a single template structure 310, the embodiments of the present description are not so limited. As shown in FIGS. 14 and 15, a second template structure 360 may be incorporated along with at least one third integrated circuit device 610*a*, 610*b*. The second template structure 360 may include through-template vias 362, as shown in FIG. 15, or not, as shown in FIG. 14. It is understood that the through-template vias 362 may be connected to additional integrated circuit devices (not shown) that could be stacked thereon or may merely be used to conduct heat. As the features and interconnections with regard to the at least one third integrated circuit device 610*a*, 610*b*, and the second template structure 360 will be similar to the features and interconnections previously described and discussed, they will not be labeled or discussed herein for brevity and conciseness.

Figure 16:
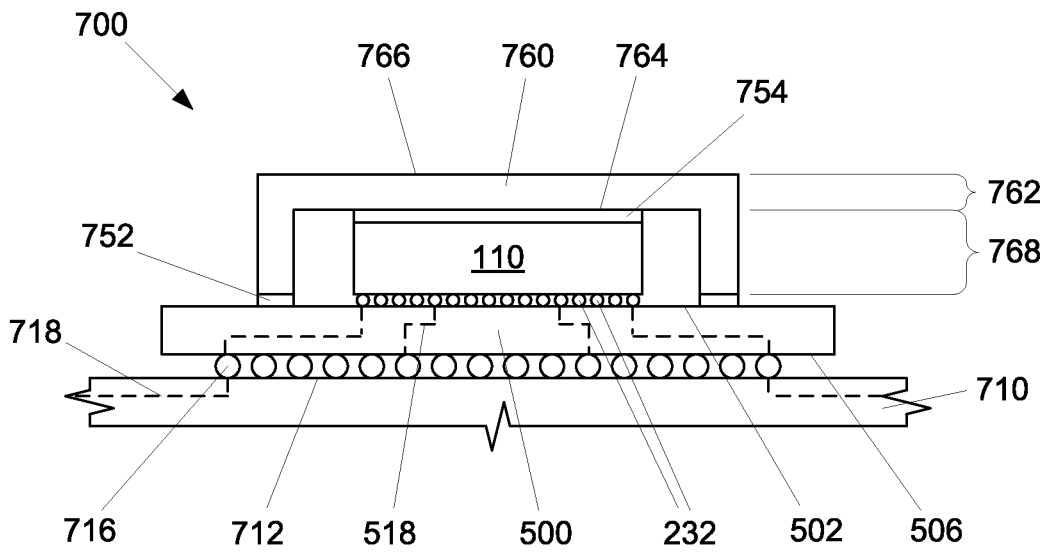
FIG. 16 is a side cross-sectional view of a system assembly, according to embodiments of the present description.

FIG. 16 illustrates the embodiments of the present description incorporated into an electronic system 700. The at least one integrated circuit assembly 110 (simply illustrated as a box without detail) and the package substrate 500 may be electrically attached to an electronic substrate or "board" 710 in a configuration generally known as a flip-chip or controlled collapse chip connection ("C4") configuration, according to an embodiment of the present description. In an embodiment of the present description, the package substrate 500 may be attached to the electronic substrate or board 710 with a plurality of package-to-substrate interconnects 716. In one embodiment of the present description, the package-to-substrate interconnects 716 may extend between bond pads (not shown) proximate a first surface 712 of the electronic substrate 710 and bond pads (not shown) proximate a second surface 506 of the package substrate 500. Although FIG. 16 shows the package substrate 500 attached to the electronic substrate 710 with an interconnect-type attachment, the embodiments of the present description are not so limited. For example, the integrated circuit package substrate 500 may be attached to a socket (not shown) that is electrically attached to the first surface 712 of the electronic substrate 710.

The electronic substrate 710 may comprise any of the materials and/or structures as discussed previously with regard to the package substrate 500. The electronic substrate 710 may further include conductive routes 718 or "metallization" (shown in dashed lines) extending through the electronic substrate 710, which may comprise any of the materials and/or structures as discussed previously with regard to the conductive routes 508 of the package substrate 500. Bond pads (not shown) proximate the first surface 712 of the electronic substrate 710 may be in electrical contact with the conductive routes 718, and the conductive routes 718 may extend through the electronic substrate 710. As will be understood to those skilled in the art, the electronic substrate 710 may be a cored substrate or a coreless substrate.

As further shown in FIG. 16, the electronic system 700 may further include a heat dissipation device 760. The heat dissipation device 760 may include, but is not limited to, an integrated heat spreader (shown), a heat dissipation plate, or any such thermally conductive device, that may be thermally coupled with the integrated circuit assembly 110 with a thermal interface material 754. The heat dissipation device 760 may comprise a main body 762, having a first surface 764 and an opposing second surface 766, and at least one boundary wall 768 extending from the first surface 764 of the main body 762 of the heat dissipation device 760. The at least one boundary wall 768 may be attached or sealed to the first surface 502 of the package substrate 500 with an attachment adhesive or sealant layer 752.

The heat dissipation device 760 may be made of any appropriate thermally conductive material, including, but not limited to, at least one metal material and alloys of more than one metal, or highly doped glass or highly conductive ceramic material, such as aluminum nitride. In an embodiment of the present description, the heat dissipation device 760 may comprise copper, nickel, aluminum, alloys thereof, laminated metals including coated materials (such as nickel coated copper), and the like. The internal thermal interface material 754 may be any appropriate, thermally conductive material, including, but not limited to, a thermal grease, a thermal gap pad, a polymer, an epoxy filled with high thermal conductivity fillers (such as metal particles or silicon particles), a metal alloy (such as solder or liquid metal), and the like.

As illustrated in FIG. 16, the heat dissipation device 760 may be a single material throughout, such as when the heat dissipation device 760, including the heat dissipation device boundary wall 768, is formed by a single process step, including but not limited to, stamping, skiving, molding, and the like. However, embodiments of the present description may also include the heat dissipation device 760 being made of more than one component. For example, the heat dissipation device boundary wall 768 may be formed separately from the main body 762, then attached together to form the heat dissipation device 760. In one embodiment of the present description, the boundary wall 772 may be a single "picture frame" structure surrounding the integrated circuit device 720.

The attachment adhesive 752 may be any appropriate material, including, but not limited to, silicones (such as polydimethylsiloxane), epoxies, and the like. It is understood that the boundary wall 768 not only secures the heat dissipation device 760 to the package substrate 710, but also helps to maintain a desired distance (e.g., bond line thickness) between the first surface 764 of the heat dissipation device 760 and the integrated circuit assembly 110.

Figure 17:
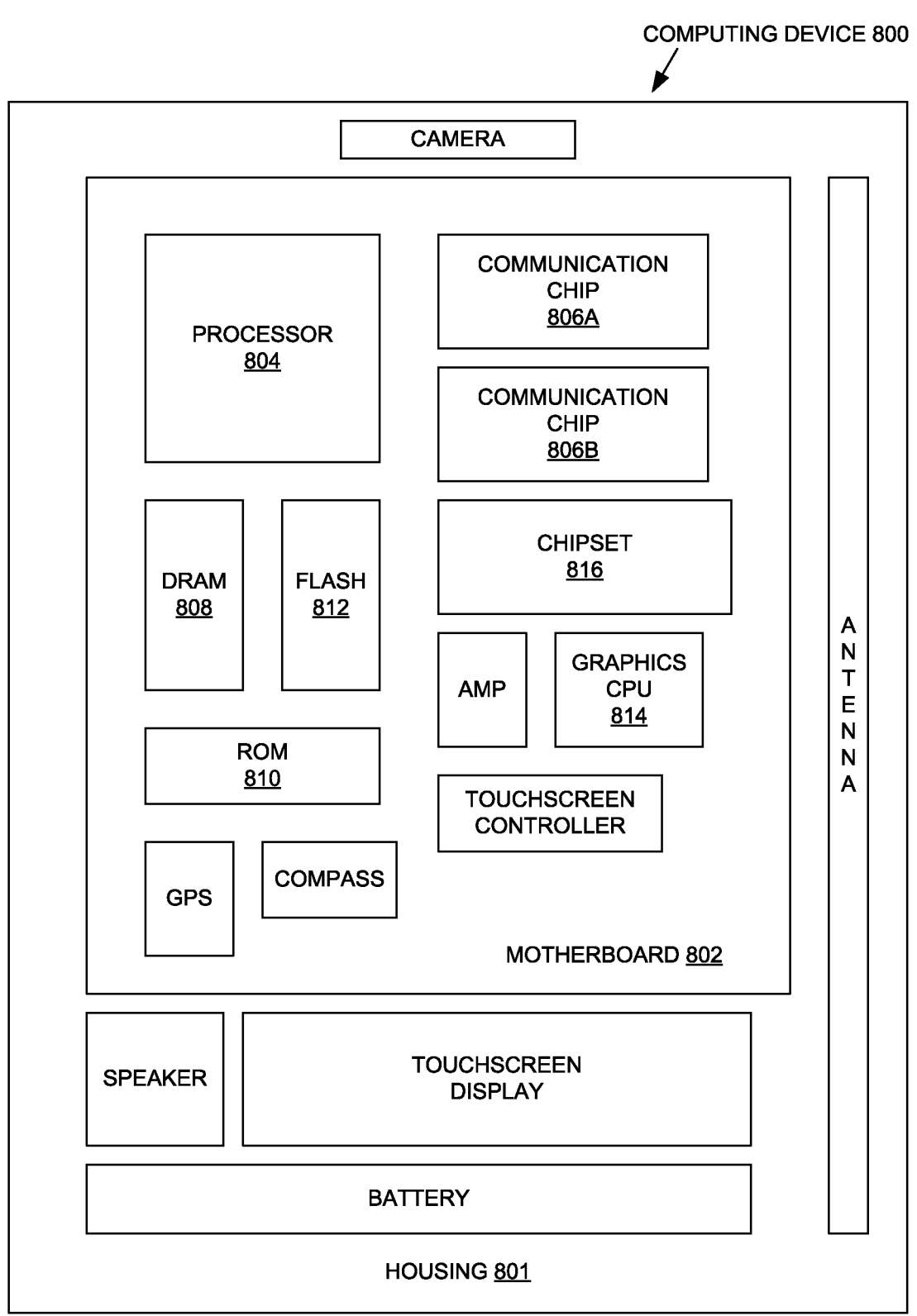
FIG. 17 is schematic view of an electronic system, according to one embodiment of the present description.

FIG. 17 illustrates an electronic or computing device/ system 800 in accordance with one implementation of the present description. The computing device 800 may include a housing 801 having a board 802 disposed therein. The computing device 800 may include a number of integrated circuit components, including but not limited to a processor 804, at least one communication chip 806A, 806B, volatile memory 808 (e.g., DRAM), non-volatile memory 810 (e.g., ROM), flash memory 812, a graphics processor or CPU 814, a digital signal processor (not shown), a crypto processor (not shown), a chipset 816, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 802. In some implementations, at least one of the integrated circuit components may be a part of the processor 804.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit assembly of any of the embodiment of the present description.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-17. The subject matter may be applied to various heat dissipation assemblies, other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an apparatus, comprising a first integrated circuit device having a first surface, an opposing second surface, and at least one side extending between the first surface and the second surface, wherein the at least one side defines a periphery of the first integrated circuit device; a template structure having a first surface, an opposing second surface, at least one side extending between the first surface and the second surface, and at least one opening extending between the first surface and the second surface, wherein the at least one side defines a periphery of the template structure, wherein the first surface of the template structure is attached to the first surface of the first integrated circuit device, and wherein the periphery of the first integrated circuit device is substantially planar with the periphery of the template structure; and at least one second integrated circuit device within the opening of the template structure, wherein the at least one second integrated circuit device is electrically attached to the first surface of the first integrated circuit device.

In Example 2, the subject matter of Example 1 can optionally include a fill material disposed between the template structure and the at least one second integrated circuit device.

In Example 3, the subject matter of Example 2 can optionally include a barrier layer between the fill material and the opening of the template structure and between the fill material and the at least one second integrated circuit device.

In Example 4, the subject matter of any of Examples 1 to 3 can optionally include the at least one second integrated circuit device having a first surface and an opposing second surface, wherein the first surface of the at least one second integrated circuit device is electrically attached to the first surface of the first integrated circuit device, and wherein the second surface of the at least one second integrated circuit device is substantially planar to the second surface of the template structure.

In Example 5, the subject matter of any of Examples 1 to 4 can optionally include the first integrated circuit device having a circuit region at the first surface thereof and a plurality of through-silicon vias extending from the circuit region to the second surface of first integrated circuit.

In Example 6, the subject matter of Example 5 can optionally include a plurality of interconnects electrically attached to the at least one through-silicon vias.

In Example 7, the subject matter of any of Examples 1 to 6 can optionally include the template structure comprising a thermally conductive material.

In Example 8, the subject matter of any of Examples 1 to 7 can optionally include the template structure having a coefficient of thermal expansion that is substantially the same as the coefficient of thermal expansion of the first integrated circuit device.

Example 9 is an apparatus, comprising a package substrate; a first integrated circuit device having a first surface, an opposing second surface, and at least one side extending between the first surface and the second surface, wherein the at least one side defines a periphery of the first integrated circuit device, and wherein the second surface of the first integrated circuit device is electrically attached to the package substrate; a template structure having a first surface, an opposing second surface, at least one side extending between the first surface and the second surface, and at least one opening extending between the first surface and the second surface, wherein the at least one side defines a periphery of the template structure, wherein the first surface of the template structure is attached to the first surface of the first integrated circuit device, and wherein the periphery of the first integrated circuit device is substantially planar with the periphery of the template structure; and at least one second integrated circuit device within the opening of the template structure, wherein the at least one second integrated circuit device is electrically attached to the first surface of the first integrated circuit device.

In Example 10, the subject matter of Example 9 can optionally include a fill material disposed between the template structure and the at least one second integrated circuit device.

In Example 11, the subject matter of Example 10 can optionally include a barrier layer between the fill material and the opening of the template structure and between the fill material and the at least one second integrated circuit device.

In Example 12, the subject matter of any of Examples 9 to 11 can optionally include the at least one second integrated circuit device having a first surface and an opposing second surface, wherein the first surface of the at least one second integrated circuit device is electrically attached to the first surface of the first integrated circuit device, and wherein the second surface of the at least one second integrated circuit device is substantially planar to the second surface of the template structure.

In Example 13, the subject matter of any of Examples 9 to 12 can optionally include the first integrated circuit device having a circuit region at the first surface thereof and a plurality of through-silicon vias extending from the circuit region to the second surface of first integrated circuit.

In Example 14, the subject matter of Example 13 can optionally include a plurality of interconnects electrically attached to the at least one through-silicon vias.

In Example 15, the subject matter of any of Examples 9 to 14 can optionally include the template structure comprising a thermally conductive material.

In Example 16, the subject matter of any of Examples 9 to 15 can optionally include the template structure having a coefficient of thermal expansion that is substantially the same as the coefficient of thermal expansion of the first integrated circuit device.

Example 17 is a system, comprising an electronic board and an integrated circuit package electrically attached to the electronic board, wherein the integrated circuit package comprises a package substrate; a first integrated circuit device having a first surface, an opposing second surface, and at least one side extending between the first surface and the second surface, wherein the at least one side defines a periphery of the first integrated circuit device, and wherein the second surface of the first integrated circuit device is electrically attached to the package substrate; a template structure having a first surface, an opposing second surface, at least one side extending between the first surface and the second surface, and at least one opening extending between the first surface and the second surface, wherein the at least one side defines a periphery of the template structure, wherein the first surface of the template structure is attached to the first surface of the first integrated circuit device, and wherein the periphery of the first integrated circuit device is substantially planar with the periphery of the template structure; and at least one second integrated circuit device within the opening of the template structure, wherein the at least one second integrated circuit device is electrically attached to the first surface of the first integrated circuit device.

In Example 18, the subject matter of Example 17 can optionally include a fill material disposed between the template structure and the at least one second integrated circuit device.

In Example 19, the subject matter of Example 18 can optionally include a barrier layer between the fill material and the opening of the template structure and between the fill material and the at least one second integrated circuit device.

In Example 20, the subject matter of any of Examples 17 to 19 can optionally include the at least one second integrated circuit device having a first surface and an opposing second surface, wherein the first surface of the at least one second integrated circuit device is electrically attached to the first surface of the first integrated circuit device, and wherein the second surface of the at least one second integrated circuit device is substantially planar to the second surface of the template structure.

In Example 21, the subject matter of any of Examples 17 to 20 can optionally include the first integrated circuit device having a circuit region at the first surface thereof and a plurality of through-silicon vias extending from the circuit region to the second surface of first integrated circuit.

In Example 22, the subject matter of Example 21 can optionally include a plurality of interconnects electrically attached to the at least one through-silicon vias.

In Example 23, the subject matter of any of Examples 17 to 22 can optionally include the template structure comprising a thermally conductive material.

In Example 24, the subject matter of any of Examples 17 to 23 can optionally include the template structure having a coefficient of thermal expansion that is substantially the same as the coefficient of thermal expansion of the first integrated circuit device.

Example 25 is an apparatus, comprising a first integrated circuit device having a first surface, an opposing second surface, and at least one side extending between the first surface and the second surface, wherein the at least one side defines a periphery of the first integrated circuit device; a template structure having a first surface, an opposing second surface, at least one side extending between the first surface and the second surface, and at least one opening extending between the first surface and the second surface, wherein the at least one side defines a periphery of the template structure, wherein the first surface of the template structure is attached to the first surface of the first integrated circuit device, wherein the periphery of the first integrated circuit device is substantially planar with the periphery of the template structure, and wherein the template structure includes at least one through-template via; and at least one second integrated circuit device within the opening of the template structure, wherein the at least one second integrated circuit device is electrically attached to the first surface of the first integrated circuit device.

US 12,564,090 B2

15                                                              16

In Example 26, the subject matter of Example 25 can optionally include the at least one second integrated circuit device having a first surface and an opposing second surface, wherein the first surface of the at least one second integrated circuit device is electrically attached to the first surface of the first integrated circuit device, and wherein the at least one second integrated circuit device has a circuit region at the first surface thereof and at least one through-silicon vias extending from the circuit region to the second surface of the at least one second integrated circuit device.

In Example 27, the subject matter of any of Examples 25 to 26 can optionally include the second surface of the at least one second integrated circuit device being substantially planar to the second surface of the template structure.

In Example 28, the subject matter of any of Examples 25 to 27 can optionally include a plurality of interconnects electrically attached to the at least one through-silicon vias.

In Example 29, the subject matter of any of Examples 25 to 28 can optionally include a fill material disposed between the template structure and the at least one second integrated circuit device.

In Example 30, the subject matter of Example 29 can optionally include a barrier layer between the fill material and the opening of the template structure and between the fill material and the at least one second integrated circuit device.

In Example 31, the subject matter of any of Examples 25 to 30 can optionally include a plurality of interconnects electrically attached to the at least one through-silicon vias.

Example 32 is an apparatus, comprising a package substrate; a first integrated circuit device having a first surface, an opposing second surface, and at least one side extending between the first surface and the second surface, wherein the at least one side defines a periphery of the first integrated circuit device, and wherein the second surface of the first integrated circuit device is electrically attached to the package substrate; a template structure having a first surface, an opposing second surface, at least one side extending between the first surface and the second surface, and at least one opening extending between the first surface and the second surface, wherein the template structure includes at least one through-template via, wherein the at least one side defines a periphery of the template structure, wherein the first surface of the template structure is attached to the first surface of the first integrated circuit device, and wherein the periphery of the first integrated circuit device is substantially planar with the periphery of the template structure; and at least one second integrated circuit device within the opening of the template structure, wherein the at least one second integrated circuit device is electrically attached to the first surface of the first integrated circuit device.

In Example 33, the subject matter of Example 32 can optionally include the at least one second integrated circuit device having a first surface and an opposing second surface, wherein the first surface of the at least one second integrated circuit device is electrically attached to the first surface of the first integrated circuit device, and wherein the at least one second integrated circuit device has a circuit region at the first surface thereof and at least one through-silicon vias extending from the circuit region to the second surface of the at least one second integrated circuit device.

In Example 34, the subject matter of any of Examples 32 to 33 can optionally include the second surface of the at least one second integrated circuit device being substantially planar to the second surface of the template structure.

In Example 35, the subject matter of any of Examples 32 to 34 can optionally include a plurality of interconnects electrically attached to the at least one through-silicon vias.

In Example 36, the subject matter of any of Examples 32 to 35 can optionally include a fill material disposed between the template structure and the at least one second integrated circuit device.

In Example 37, the subject matter of Example 36 can optionally include a barrier layer between the fill material and the opening of the template structure and between the fill material and the at least one second integrated circuit device.

In Example 38, the subject matter of any of Examples 32 to 37 can optionally include a plurality of interconnects electrically attached to the at least one through-silicon vias.

Example 39 is a system, comprising an electronic board and an integrated circuit package electrically attached to the electronic board, wherein the integrated circuit package comprises a package substrate; a first integrated circuit device having a first surface, an opposing second surface, and at least one side extending between the first surface and the second surface, wherein the at least one side defines a periphery of the first integrated circuit device, and wherein the second surface of the first integrated circuit device is electrically attached to the package substrate; a template structure having a first surface, an opposing second surface, wherein the template structure includes at least one through-template via, at least one side extending between the first surface and the second surface, and at least one opening extending between the first surface and the second surface, wherein the at least one side defines a periphery of the template structure, wherein the first surface of the template structure is attached to the first surface of the first integrated circuit device, and wherein the periphery of the first integrated circuit device is substantially planar with the periphery of the template structure; and at least one second integrated circuit device within the opening of the template structure, wherein the at least one second integrated circuit device is electrically attached to the first surface of the first integrated circuit device.

In Example 40, the subject matter of Example 39 can optionally include the at least one second integrated circuit device having a first surface and an opposing second surface, wherein the first surface of the at least one second integrated circuit device is electrically attached to the first surface of the first integrated circuit device, and wherein the at least one second integrated circuit device has a circuit region at the first surface thereof and at least one through-silicon vias extending from the circuit region to the second surface of the at least one second integrated circuit device.

In Example 41, the subject matter of any of Examples 39 to 40 can optionally include the second surface of the at least one second integrated circuit device being substantially planar to the second surface of the template structure.

In Example 42, the subject matter of any of Examples 39 to 41 can optionally include a plurality of interconnects electrically attached to the at least one through-silicon vias.

In Example 43, the subject matter of any of Examples 39 to 42 can optionally include a fill material disposed between the template structure and the at least one second integrated circuit device.

In Example 44, the subject matter of Example 43 can optionally include a barrier layer between the fill material and the opening of the template structure and between the fill material and the at least one second integrated circuit device.

In Example 45, the subject matter of Examples 39 to 44 can optionally include a plurality of interconnects electrically attached to the at least one through-silicon vias.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
a first integrated circuit device having a first surface, an opposing second surface, and at least one side extending between the first surface and the second surface, wherein the at least one side defines a periphery of the first integrated circuit device;
a first interconnection layer on the first surface of the first integrated circuit device;
a template structure having a first surface, an opposing second surface, at least one side extending between the first surface and the second surface, and at least one opening extending between the first surface and the second surface, wherein the at least one side defines a periphery of the template structure;
a second interconnection layer on the first surface of the template structure;
a second integrated circuit device within the opening of the template structure; and
a third interconnection layer on a first surface of the second integrated circuit device, wherein the first interconnection layer is coupled to the second interconnection layer between the first integrated circuit device and the template structure, and wherein the first interconnection layer is coupled to the third interconnection layer between the first integrated circuit device and the second integrated circuit device.

2. The apparatus of claim 1, further comprising a silicon dioxide fill material between the template structure and the second integrated circuit device.

3. The apparatus of claim 1, wherein the template structure is glass.

4. The apparatus of claim 1, wherein the second integrated circuit device has a second surface opposing the first surface, wherein the second surface of the second integrated circuit device is substantially planar to the second surface of the template structure.

5. The apparatus of claim 1, wherein the second integrated circuit device has a circuit region at the first surface thereof and at least one through-silicon vias extending from the circuit region to the second surface of the second integrated circuit device.

6. The apparatus of claim 1, further comprising:
a package substrate,
wherein the second surface of the first integrated circuit device is electrically attached to the package substrate.

7. The apparatus of claim 6, further comprising:
an electronic board; and
an integrated circuit package electrically attached to the electronic board, wherein the integrated circuit package comprises the package substrate, the first integrated circuit device, the first interconnection layer, the template structure, the second interconnection layer, the second integrated circuit device, and the third interconnection layer.

8. An apparatus, comprising:
a first integrated circuit device having a first surface, an opposing second surface, and at least one side extending between the first surface and the second surface, wherein the at least one side defines a periphery of the first integrated circuit device;
a template structure having a first surface, an opposing second surface, at least one side extending between the first surface and the second surface, and at least one opening extending between the first surface and the second surface, wherein the at least one side defines a periphery of the template structure, wherein the first surface of the template structure is attached to the first surface of the first integrated circuit device by an oxide-oxide bond, and wherein the periphery of the first integrated circuit device is substantially planar with the periphery of the template structure;
a second integrated circuit device within the opening of the template structure, wherein the second integrated circuit device is electrically attached to the first surface of the first integrated circuit device; and
a silicon dioxide fill material between the template structure and the second integrated circuit device.

9. The apparatus of claim 8, wherein the template structure is one of copper tungsten, silicon carbide, or diamond.

10. The apparatus of claim 8, further comprising a barrier layer between the silicon dioxide fill material and the template structure and between the silicon dioxide fill material and the second integrated circuit device.

11. The apparatus of claim 8, wherein the second integrated circuit device has a first surface and an opposing second surface, wherein the first surface of the second integrated circuit device is electrically attached to the first surface of the first integrated circuit device, and wherein the second surface of the second integrated circuit device is substantially planar to the second surface of the template structure.

12. The apparatus of claim 8, wherein the second integrated circuit device has a circuit region at the first surface thereof and at least one through-silicon vias extending from the circuit region to the second surface of the second integrated circuit device.

13. The apparatus of claim 8, further comprising:
a package substrate, wherein the second surface of the first integrated circuit device is electrically attached to the package substrate.

14. The apparatus of claim 13, further comprising:
an electronic board; and
an integrated circuit package electrically attached to the electronic board, wherein the integrated circuit package comprises the package substrate, the first integrated circuit device, the template structure, and the second integrated circuit device.

15. An apparatus, comprising:
a first integrated circuit device having a first surface, an opposing second surface, and at least one side extending between the first surface and the second surface, wherein the at least one side defines a periphery of the first integrated circuit device;
a stainless steel template structure having a first surface, an opposing second surface, at least one side extending between the first surface and the second surface, and at least one opening extending between the first surface and the second surface, wherein the at least one side defines a periphery of the stainless steel template structure, wherein the first surface of the stainless steel template structure is attached to the first surface of the first integrated circuit device, and wherein the periphery of the first integrated circuit device is substantially planar with the periphery of the stainless steel template structure; and
a second integrated circuit device within the opening of the stainless steel template structure, wherein the second integrated circuit device is electrically attached to the first surface of the first integrated circuit device.

16. The apparatus of claim 15, wherein the first surface of the stainless steel template structure is attached to the first surface of the first integrated circuit device by an oxide-oxide bond.

17. The apparatus of claim 15, further comprising a silicon dioxide fill material between the stainless steel template structure and the second integrated circuit device.

18. The apparatus of claim 15, wherein the second integrated circuit device has a first surface and an opposing second surface, wherein the first surface of the second integrated circuit device is electrically attached to the first surface of the first integrated circuit device, and wherein the second surface of the second integrated circuit device is substantially planar to the second surface of the stainless steel template structure.

19. The apparatus of claim 15, further comprising:

a package substrate, wherein the second surface of the first integrated circuit device is electrically attached to the package substrate.

20. The apparatus of claim 19, further comprising:

an electronic board; and an integrated circuit package electrically attached to the electronic board, wherein the integrated circuit package comprises the package substrate, the first integrated circuit device, the stainless steel template structure, and the second integrated circuit device.

* * * * *